United States Patent
Hermanns et al.

(10) Patent No.: US 9,926,627 B2
(45) Date of Patent: Mar. 27, 2018

(54) SYSTEM AND METHODS FOR PROCESSING A SUBSTRATE

(75) Inventors: Uwe Hermanns, Karlstein am Main (DE); Neil Morrison, Darmstadt (DE); Tobias Stolley, Oberursel (DE); Volker Hacker, Altenstadt-Oberau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 627 days.

(21) Appl. No.: 14/364,687

(22) PCT Filed: Dec. 21, 2011

(86) PCT No.: PCT/EP2011/073634
§ 371 (c)(1),
(2), (4) Date: Dec. 3, 2014

(87) PCT Pub. No.: WO2013/091694
PCT Pub. Date: Jun. 27, 2013

(65) Prior Publication Data
US 2015/0079271 A1    Mar. 19, 2015

(51) Int. Cl.
| | |
|---|---|
| C23C 16/503 | (2006.01) |
| C23C 14/54 | (2006.01) |
| C23C 14/56 | (2006.01) |
| C23C 16/44 | (2006.01) |
| C23C 16/52 | (2006.01) |
| C23C 16/54 | (2006.01) |

(52) U.S. Cl.
CPC ............ *C23C 16/503* (2013.01); *C23C 14/54* (2013.01); *C23C 14/562* (2013.01); *C23C 14/564* (2013.01); *C23C 16/4401* (2013.01); *C23C 16/52* (2013.01); *C23C 16/545* (2013.01)

(58) Field of Classification Search
None
See application file for complete search history.

(56) References Cited

FOREIGN PATENT DOCUMENTS

| | | |
|---|---|---|
| EP | 1849888 A1 | 10/2007 |
| EP | 1870488 A1 | 12/2007 |
| EP | 1881087 A1 | 1/2008 |
| JP | 05239616 | * 9/1993 |
| JP | 7109571 A | 4/1995 |
| JP | 11238595 | * 8/1999 |

(Continued)

OTHER PUBLICATIONS

International Search Report issued in corresponding international application No. PCT/EP2011/073634, dated Sep. 19, 2012.

(Continued)

*Primary Examiner* — Nathan T Leong
(74) *Attorney, Agent, or Firm* — Patterson + Sheridan, LLP

(57) ABSTRACT

According to the present disclosure, a substrate processing apparatus for processing a flexible substrate including a vacuum chamber configured for being evacuated and being configured for having a process gas provided therein, a processing module adapted to process the flexible substrate, wherein the processing module is provided within the vacuum chamber, and a discharging assembly configured to generate a flow of charged particles to discharge the flexible substrate is provided. The discharging assembly is configured to generate an electric field for ionizing a processing gas.

9 Claims, 5 Drawing Sheets

(56) References Cited

FOREIGN PATENT DOCUMENTS

| JP | 11238595 A | 8/1999 |
|---|---|---|
| JP | 5239616 B2 | 7/2013 |
| WO | 92/12612 A1 | 7/1992 |

OTHER PUBLICATIONS

Chinese Office Action dated Nov. 7, 2016 for Application No. 201180075640.3.
Taiwan Office Action dated Nov. 30, 2016 for Application No. 101148453.

* cited by examiner

SYSTEM AND METHODS FOR PROCESSING A SUBSTRATE

TECHNICAL FIELD OF THE INVENTION

The subject matter described herein relates generally to methods and systems for processing a substrate, and more particularly, to methods and systems concerning flexible substrate processing applications, even more particularly, the in-line processing in vacuum of flexible substrate processing applications.

BACKGROUND OF THE INVENTION

In installations used for coating flexible substrates, typically a web of a synthetic or polymeric film and herein also referred to as web-form material, a first web drum is unwound, the wound-off web-form material is coated, for example by sputtering, chemical vaporization deposition (CVD) and wound up again on a second web drum. The aforementioned first and/or second web drums may be replaced with new and full web drums and/or empty web drums whenever necessary. The term web drum is also referred to herein as web module.

In known arrangements and methods for coating a web-form material, the steps of winding up and unwinding the web-form material are conducted in winding up and unwinding chambers, typically separated from the one or more coating sites. Further, the web-form material may be directed over a multitude of guiding or re-directing rollers when travelling from the unwinding drum, over the coating site, which may be in a separate processing chamber, to the winding up drum.

Typically, flexible web-form materials such as, for example, polymeric web substrates may charge electrically on winding and/or unwinding due to frictional contact-induced charge separation. Generally, charge generation may occur on web-form materials, especially, when they rub, slide or separate from other surfaces during processing. Often, the more rapidly this occurs the greater are the amounts of charges likely to be generated. Hence, depending on the type of coating, typical, installations for coating web-form substrates may move the web-form material at low speeds of, for example, 0.1 to 25 m/min or 0.2 to 50 m/min, or at high speeds of, for example, 10 to 20 m/s or more. Further, charge accumulation may occur since the web-form substrates often consist of polymeric materials with high surface resistivity. Furthermore, since web-form substrates often travel long distances inside a processing installation, for example, during a coating process charge leakage from the web-form substrate to earth may be restricted.

In general, enhanced installation design may reduce electrostatic charge on a substrate, for example by ensuring adequate earth grounding of all metal parts of the equipment so that dangerous quantities of electrical charge may be prevented from accumulating. Further, the mechanical handling of flexible web-form substrates may be designed, for example to minimize sliding on stalled rolls. Furthermore, antistatic coatings may be used for processing a flexible web-form substrate.

Nevertheless, in most instances during processing, the web-form substrate is unavoidably in frictional contact with more than one substrate handling device (e.g. guide or re-directing rollers) or unwound resulting in the presence of static charges on the web-form surfaces. It follows that static charge levels in the range of ten's of kV may be present on the surfaces of web-form materials during processing. These charges may electrostatically attract unwanted particles to the surfaces of the web-form material, for example, particles generated in the process and/or winding/unwinding chambers. Further, for instance, particles of silicon oxides generated in the winding/unwinding modules due to outgas sing of the web-form material may adhere onto the electrostatically charged surfaces of the web-form material. Furthermore, particles from the processing gas, for instance silane particles may flow from the one or more coating sites to the winding/unwinding modules during processing.

Such unwanted particle accumulation on the surfaces of the web-form material may lead to the destruction of the product. For instance, unwanted particles that adhere to the surface of the web-form material before coating, e.g., in-between the unwinding module and coating site may cause arcing during the coating process leading to web cutting and ultimately to the destruction and loss of the product. Further, defects at the web surface such as scratching may result from unwanted particles adhering to the surface of the web-form material, e.g., in-between the coating site and winding module.

In other instances, for example, the accumulation of unwanted particles may disrupt the homogeneity of the thin-film that is deposited on the web-form material during a coating process such as, for example, during sputtering. Furthermore, measurements of web thickness by, for instance, gauging systems may be distorted by the accumulation of unwanted particles on the surfaces of the web-form material. Such distortions may then compromise product changeover times, roll quality, product uniformity or shift repeatability.

The aforementioned damaging effects to the web-form material may be multiplied if the web-form material is exposed to the coating process more than once, i.e. when a surface of the web-form substrate is exposed to multiple coating steps. It follows that the costs incurred due to product loss through contamination with unwanted particles adhering to the surface of web-form materials before and after the coating process may be substantial.

For this purpose, it will be appreciated that systems and methods to significantly reduce or eliminate unwanted particle contamination on web-form materials before and/or after the coating process are desired. Hence, the subject matter described herein pertains to such methods and systems that reduce or eliminate unwanted particle accumulation on the surfaces of web-form materials.

BRIEF DESCRIPTION OF THE INVENTION

In light of the above, the substrate processing apparatus for processing a flexible substrate and the method for discharging a flexible substrate within a vacuum chamber are provided.

In one aspect, a substrate processing apparatus for processing a flexible substrate, including a vacuum chamber configured for being evacuated and being configured for having a process gas provided therein, and a discharging assembly configured to generate a flow of charged particles to discharge the flexible substrate, wherein the discharging assembly is configured to generate an electrical field for ionizing the processing gas is provided.

In another aspect, a method to discharge a flexible substrate within a vacuum chamber, wherein said method includes ionizing a process gas within the vacuum chamber such that a flow of charged particles discharges the flexible substrate is provided.

Further aspects, advantages and features of the present invention are apparent from the dependent claims, the description and the accompanying drawings.

Embodiments described herein are also directed to apparatuses for carrying out the disclosed methods and including apparatus parts for performing described method steps. Furthermore, embodiments described herein are also directed to methods by which the described apparatus operates or by which the described apparatus is manufactured. It may include method steps for carrying out functions of the apparatus or manufacturing parts of the apparatus. The method steps may be performed by way of hardware components, firmware, software, a computer programmed by appropriate software, by any combination thereof or in any other manner.

It is contemplated that elements of one embodiment may be advantageously utilized in other embodiments without further recitation.

BRIEF DESCRIPTION OF THE DRAWINGS

A full and enabling disclosure including the best mode thereof, to one of ordinary skill in the art, is set forth more particularly in the remainder of the specification, including reference to the accompanying figures wherein.

DETAILED DESCRIPTION OF THE INVENTION

Figure 1:
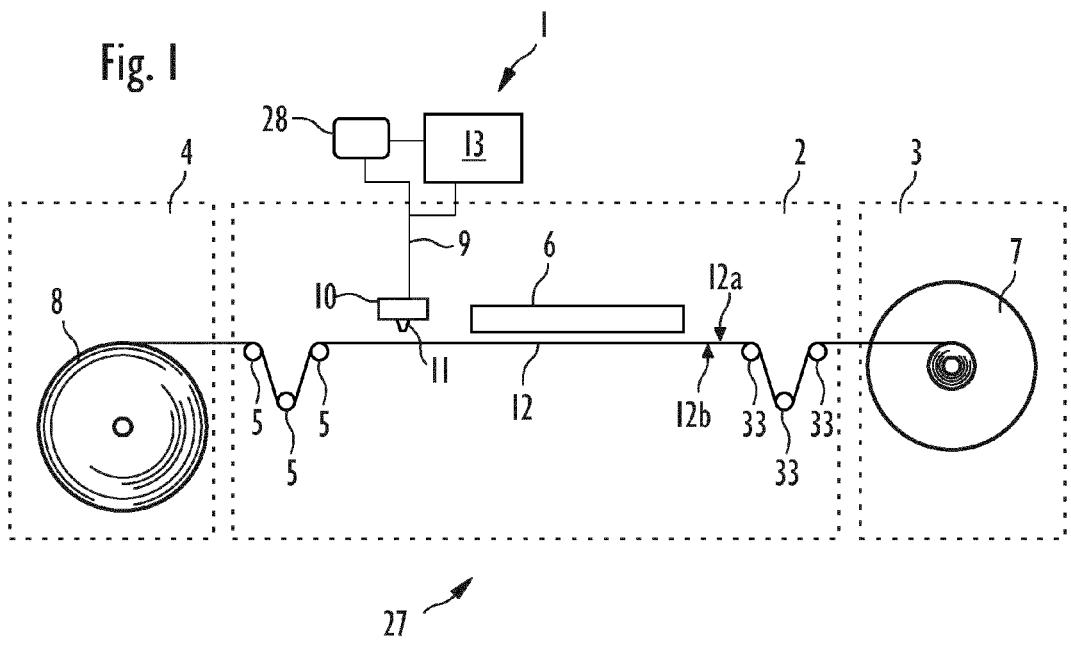
FIG. 1 is a schematic view of a substrate processing apparatus for processing a flexible substrate including a coating module according to embodiments described herein.

Reference will now be made in detail to the various embodiments, one or more examples of which are illustrated in each figure. Each example is provided by way of explanation and is not meant as a limitation of the invention. For example, features illustrated or described as part of one embodiment can be used on or in conjunction with other embodiments to yield yet further embodiments. It is intended that the present disclosure include such modifications and variations.

In general, the embodiments described herein relate to a web-form material coating apparatus that includes a discharging assembly positioned inside of a processing chamber. The discharging assembly provides a flow of charged particles originating from the electrical breakdown of a processing gas to the surfaces of a web-form material. Thereby, the web-form material may be discharged, which ensures that no unwanted particles are attracted to its surfaces, i.e., arcing during the coating process and scratching of the web-form material may be prevented by the installation of a discharging assembly within the processing chamber.

Typical applications of embodiments of the invention are in systems for coating of flexible web-form materials in a roll-to-roll process. Such systems may be, for instance, thin film deposition systems or clean room compatible vacuum web coaters, for example, including web roll driving units including a flexible web roll coupling, the web roll driving unit optionally being controlled by a control device.

Examples of the web-form material to be coated are webs of synthetic films or of papers. The coating processing may for example be accomplished by CVD, sputtering or evaporation at vacuum conditions, for instance at a base pressure in the range of $10^{-7}$ mbar. Coating can also be effected by Plasma Enhanced Chemical Vapour Deposition (PECVD) at higher pressures than sputtering and evaporation. The coating material may typically be metallic, such as aluminum, polymeric or may include organic small molecules. The coating may also be polycrystalline or amorphous, such as polycrystalline or amorphous silicon. Therefore, embodiments of the invention are useful for example in vacuum web coaters for producing Flexible Printed Circuit Boards, flexible displays using Organic Light Emitting Devices, or flexible solar cells. Moreover, embodiments of the invention may be used in systems for producing metalized protective packaging materials, such as aluminum coated thin plastic films and papers. Embodiments of the invention can also be applied in other coating systems, for instance for depositing optical or magnetic layers or antireflective, conductive and/or dielectric coatings on flexible substrates, such as for the production of window films, printed circuit boards, touch panels, TV screens or other displays.

Processors and controllers described herein process information transmitted from a plurality of electrical and electronic devices that may include, without limitation, sensors, actuators, in-line measuring instruments that may, for instance, measure sheet resistivity, optical density, spectral transmission or spectral reflection of a substrate. Further, to achieve, for example consistent overall layer thickness during a coating process, permanent closed loop control may be employed using process control and monitoring devices. Furthermore, tension of the web-form material responsible for a faultless winding may be controlled digitally.

Generally, processors may be physically located in, for example, a control or monitoring system, a sensor, a monitoring device, a desktop computer, a laptop computer, a programmable logic controller (PLC) cabinet, and/or a distributed control system (DCS) cabinet. RAM and storage devices store and transfer information and instructions to be executed by the processor(s). RAM and storage devices can also be used to store and provide temporary variables, static (i.e., non-changing) information and instructions, or other intermediate information to the processors during execution of instructions by the processor(s). Instructions that are executed may include, without limitation, installation control system control commands. The execution of sequences of instructions is not limited to any specific combination of hardware circuitry and software instructions.

In the exemplary embodiments, a real-time controller that includes any suitable processor-based or microprocessor-based system, such as a computer system, that includes microcontrollers, reduced instruction set circuits (RISC), application-specific integrated circuits (ASICs), logic circuits, and/or any other circuit or processor that is capable of executing the functions by, for example the control unit as described herein. In one embodiment, the controller may be a microprocessor that includes read-only memory (ROM) and/or random access memory (RAM), such as, for example, a 32 bit microcomputer with 2 Mbit ROM, and 64 Kbit RAM. As used herein, the term "real-time" refers to outcomes occurring in a substantially short period of time after a change in the inputs affect the outcome, with the time period being a design parameter that may be selected based on the importance of the outcome and/or the capability of the system processing the inputs to generate the outcome.

As used herein, the term "discharging assembly" is intended to be representative of any device that is capable of ionizing a gas through an electric field. The discharging assembly may either be a passive or active unit or both. Further the power supply and optionally the control unit of an active discharging assembly may be located outside of the vacuum chamber. Furthermore, the aforementioned discharge assembly may include one or more neutralizing devices that may be connected to the power supply and control unit.

In general, and without limiting the scope of the invention, the embodiments described herein are directed to a substrate processing apparatus for processing a flexible substrate in vacuum environments and a method to discharge a flexible substrate within a vacuum chamber. Embodiments of the present invention are not limited to a particular processing system but can be applied to all kinds of systems for coating a flexible web-form material in a roll-to-roll process.

In some embodiments herein, at least one discharging assembly is installed inside of the vacuum chamber of a substrate processing apparatus for processing flexible substrates. Typically, the at least one discharging assembly is positioned inside of the processing chamber, for instance, close to the point at which the actual problems are encountered. Further, the at least one discharging assembly may also be positioned close to the main source of charging, which may vary depending on the actual layout and design of the processing installation.

Depending on the type of problem experienced, discharging only one side of the web-form material may be desired. This may be relevant in applications where charges on one side of the web-form material are desired to ensure correct alignment and binding of the web-form material on the guiding rollers. However, in other occasions discharging the web-form material on both sides may be desired to achieve full neutralization since the electric field of electric charges may act through or leak over the edges of the web-form material. For this purpose, at least one discharging assembly may be positioned on either side of the web-form material such that at least one discharging assembly faces the one surface and the other at least one discharging assembly faces the other surface of the web. In this manner, the charges on each surface of the web-form material may be fully neutralized.

In embodiments described herein and in situations where the problems of arcing or particle accumulation are encountered in particular locations only, due to a particular charge distribution on the web-form material, the at least one discharging assembly may neutralize these regions specifically or, for example, may ensure net neutrality of the web-form material.

In cases where full neutralization is needed, two or more discharging assemblies may be positioned such that at least one discharging assembly faces each surface of the web-form material. The level of charge on the individual surfaces of the web-form material may be assessed by devices such as, for example, sensitive field meters that measure charge density as a web passes over a grounded roller. Such field meters may be connected directly to the at least one discharging assembly via a processor that may autonomously control the at least one discharging assembly by executing a pre-programmed charge profile, which for instance ensures full charge neutralization on one surface of the web-form material while maintaining a certain level of charge on the other.

Further, the level of charge may be detected and transmitted to a visual interface, control or monitoring station equipped with the like that enables real-time monitoring and adjustment of the charge distribution across the web-form material.

The discharging assembly described in the embodiments herein may include an active or passive neutralizer (or ionizer). Generally, passive neutralizers do not require a power source and may operate by using the charge on the surface to be discharged to generate an electric field at nearby grounded surfaces. This electric field may be concentrated at a number of points of small radii of curvature to cause the local electrical breakdown of a gas close to these points. Usually, the electrical breakdown is localized as coronas by the small radii of curvature and during the breakdown process produces ions that may move in the electric field between the corona discharge region and the surfaces to be discharged so that ions of opposite polarity to the charge on the surface of the web-form material will move to the surface of the web-form material and neutralize the charge there.

The discharging assembly adapted as passive neutralizer may operate as long as the electric field at the points of small radii of curvature is locally above the breakdown strength of the gas used. Ionization potentials may differ depending on the type of gas or gas mixtures employed. Hence, passive neutralizers may operate within a range defined by variables such as, for example, available charge intensity, gas type, pressure in the surrounding environment and size of the radius of curvature of the discharge electrode.

Since passive neutralizers depend on the static charge of the web-form material to operate they may not work when the web-form material surface charge density is too low. It follows that passive neutralizers may not be able to fully discharge a web-form material. In instances, where the web-form material must be fully discharged or where only a very low level of static is tolerable on the web-form material such as, for example, from 0 to 0.1 kV/cm the discharge assembly may be adapted as an active neutralizer.

Active neutralizers, in general, function similar to passive neutralizers as described above, however, they are typically provided with a high voltage power source that is used to generate the electric field for ionizing the gas. Therefore, the generation of ions is independent of the level of charge of the web-form material and the electric field generated by the high voltage power source on the web-form material is only involved as means for transporting ions of appropriate polarity and quantity to discharge the web-form material. Depending on the moving speeds of a web-form material, to fully discharge it the supplied power or frequency may be varied.

Generally, the power supply of the active neutralizer and its control is positioned outside of the vacuum chamber. Further, the active neutralizer may include capacitive coupling of the power supply to each of the one or more discharge points. Furthermore, the one or more discharge points may be grounded. In embodiments herein the active neutralizer may also operate as passive neutralizer in cases where the high voltage power supply is interrupted or fails.

Typically, the discharging assembly described herein may be in the shape of a lance or rod, which spans across the width of the web-form material. The lance may include several, two or more preferably evenly spaced apart spikes at which the electrical breakdown of the gas occurs. Generally, the lance functions to autonomously provide the appropriate positively or negatively charged ions to counter the static charge on the web-form material.

FIG. 1 illustrates as an example of embodiments a substrate processing apparatus 27 for processing a flexible substrate including a processing chamber 2 connected to a winding up chamber 3 and an unwinding chamber 4. Processing chamber 2 includes a coating module 6 for depositing a thin film on a web-form substrate 12. The web-form substrate 12 may travel from unwinding chamber 4 into winding chamber 3 by passing through processing chamber 2. Guide rollers 5 are arranged in processing chamber 2 for guiding the web-form substrate 12, i.e. a web to be coated or having been coated, respectively.

The unwinding chamber 4 is connected to the processing chamber 2 for feeding the web-form substrate 12 to be coated. The unwinding chamber 4 includes an unwinding module 8 (e.g. an unwinding cylinder or drum) with a reserve of wound web-form substrate 12 to be coated. The web-form substrate may be fed into the processing chamber 2, therein three guide rollers 5 may, for instance, provide a desired tension to the web-form substrate. This tension may, for example, ensure the homogenous deposition of a thin-film coating material during a coating process.

Further, a discharging assembly 1 is included in the substrate processing apparatus 27. A high voltage power supply 13, which provides high voltage power to a neutralization device 10, 11 via connection 9, may be arranged outside of the processing chamber 2. Furthermore, a control unit 28 may be provided in the discharging assembly 1. The control unit may be connected to the high voltage power supply 13 and also to the neutralization device 10, 11 via connection 9. Furthermore, the control unit 28 may obtain information from the neutralization device 10, 11 on the charges present on surfaces 12a, 12b of the web-form substrate 12. Information on the charge levels on the surfaces of a web-form substrate may also be collected from field meters (not shown in the drawings) that are positioned away from the neutralization device but connected to it via a control unit.

Control unit 28 may control and regulate different parameters of the discharging assembly 1 based on data received from the neutralization device 10, 11 and/or from any other devices such as, for instance field meters. Control unit 28 may, for example, regulate the frequency and power intensity provided to the neutralization device from the high voltage power supply 13. Furthermore, in the embodiments described herein, a control unit and/or power supply may also be integrally connected and mechanically part of the neutralization device 10, 11 and hence may be positioned inside of the processing chamber with the neutralization device 10, 11 (not shown in the drawings).

Generally, control unit 28 may initiate commands or execute pre-programmed discharging profiles such that a flow of negatively or positively charged ions is produced by the neutralization device 10, 11 that will flow to the surface of the web-form substrate such that ions of opposite polarity to the charge on the surface of the web-form substrate may move to the surface of the web-form substrate and neutralize the charge there.

The neutralization device 10, 11 of the discharge assembly 1 may be provided as neutralizing lance 10 with one or more spikes 11. The high voltage power supply 13 may provide high voltage to the one or more spikes 11 that typically have a small radius of curvature. Electrical breakdown of a processing gas in the processing chamber is localized as a corona by the small radius of curvature and is generally unable to form a spark channel to bridge the gap to the surface of the web-form substrate. However, the produced ions move as described above to neutralize the charges on the surface of the web-form substrate.

Generally, in the embodiments disclosed herein, the discharging assembly may include a passive neutralizer for which a power supply is not required. In other embodiments the use of an active neutralizer may include a power supply and control unit that are integrally connected to the active neutralizer and, therefore, may both be located inside of the processing chamber of a flexible substrate processing apparatus with the active neutralizer.

Neutralization device 10, 11 may be arranged after the set of three guide rollers 5 before coating module 6 such that it faces surface 12a of web-form substrate 12. In embodiments according to FIG. 1 coating module 6 also faces surface 12a of web-form substrate 12 such that a thin film of coating material is deposited on this surface of web-form substrate 12.

Figure 2:
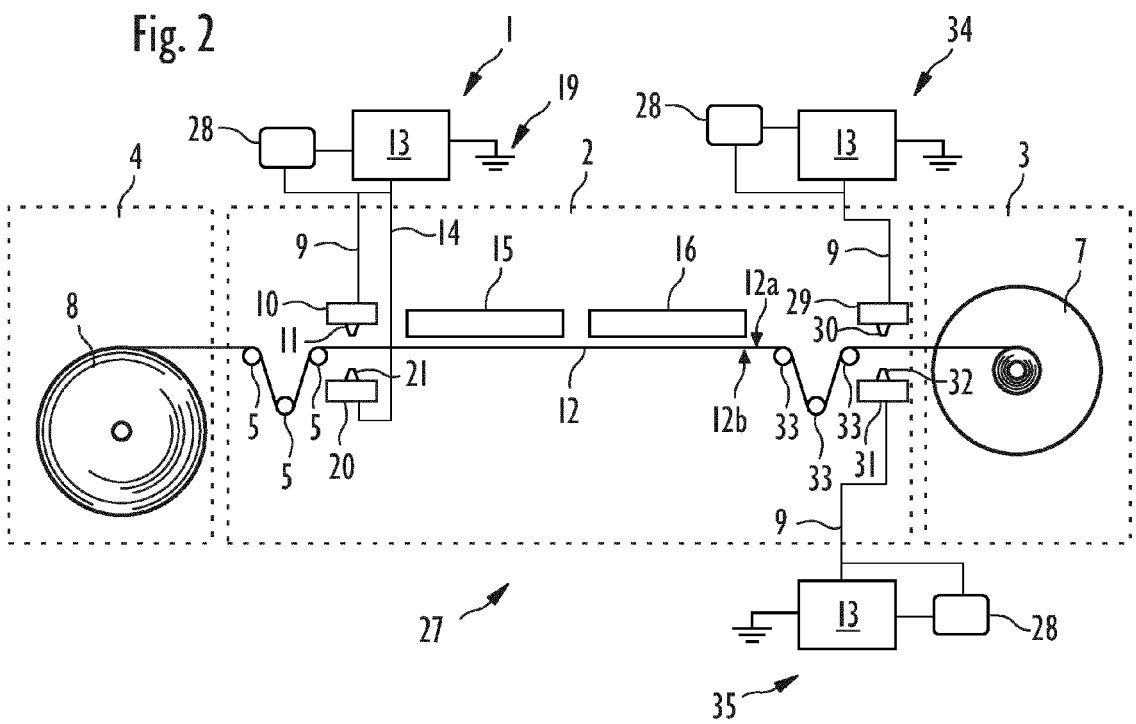
FIG. 2 is a schematic view of a substrate processing apparatus for processing a flexible substrate including two coating modules according to embodiments described herein.

FIG. 2 illustrates a web-form material coating apparatus 27 according to an example of embodiments disclosed herein. According to the example shown therein, coating apparatus 27 includes a processing chamber 2 connected to a winding up chamber 3 and an unwinding chamber 4. The coating apparatus 27 of FIG. 2 has a similar layout to web-form material processing apparatus 27 in FIG. 1 with the following exceptions.

The processing chamber 2 of the web-form processing apparatus 27 in FIG. 2 includes a first coating module 15 and second coating module 16 arranged in order to face surface 12a of web-form substrate 12. According to typical embodiments, which can be combined with other aspects and embodiments described herein, the substrate processing in an apparatus for processing a flexible substrate can be a chemical vapor deposition CVD, e.g. having a CVD source included in a coating module. Additionally, or alternatively, coating modules 15, 16 may, for example, be planar DC- or AC-magnetrons. Further, coating modules 15, 16 may also be rotatable DC- or AC-magnetrons or any combination of the rotatable and aforementioned planar magnetrons.

The web-form material coating apparatus 27 shows three discharging assemblies 1, 34 and 35 positioned such that their respective neutralizing devices are inside of processing chamber 2. The first discharging assembly 1 is positioned such that the neutralization devices 10, 11 and 20, 21 are between the first set of guide rollers 5 and the first coating module 15. Neutralization device 10, 11 is positioned to face surface 12a of the web-form substrate 12 and neutralization device 20, 21 is positioned to face surface 12b of the web-form substrate 12 such that both surfaces of the web-form substrate 12 may be discharged. In this example according to embodiments disclosed herein, both neutralization devices 10, 11 and 20, 21 are connected to the same high voltage power supply 13 and are also both controlled by the same control unit 28. A first connection 9 provides contact (electrical or communicative) between the control unit 28, power supply 13 and the first neutralization device 10, 11. A second connection 14 provides contact (electrical or communicative) between the control unit 28, power supply 13 and the second neutralization device 20, 21. Further, power supply 13 may be grounded as indicated by the grounding symbol 19 (grounding the power supply is not restricted to any one particular embodiment described herein). Furthermore, two or more neutralization devices may also be connected in series to, for example, a power supply and control unit (not shown in the FIGS.).

Typically, a control unit may control the power provided by a power supply to one or more neutralizing devices. In particular, the control unit may regulate the amount and frequency of the power which the power supply provides, for example, to each of the one or more spikes of one or more neutralizing devices (e.g. neutralizing lances).

The second discharging assembly 34 includes a neutralization device 29, 30 that is positioned behind the second coating module 16 and after the second set of guide rollers 33. Neutralization device 29, 30 faces surface 12a of web-form substrate 12 such that it may discharge surface 12a by directing a flow of charged ions from its electrical breakdown sites to surface 12a. Neutralization device 29, 30 is connected to control unit 28 and power supply 13 via connection 9.

The third discharging assembly 35 is set up similarly to the second discharging assembly 34 as described above. It also includes a neutralization device 31, 32 that is positioned behind the second coating module 16 and after the second set of guide rollers 33. However, neutralization device 31, 32 faces surface 12b of web-form substrate 12 such that it may discharge surface 12b by directing a flow of charged ions from its electrical breakdown sites to surface 12b.

Figure 3:
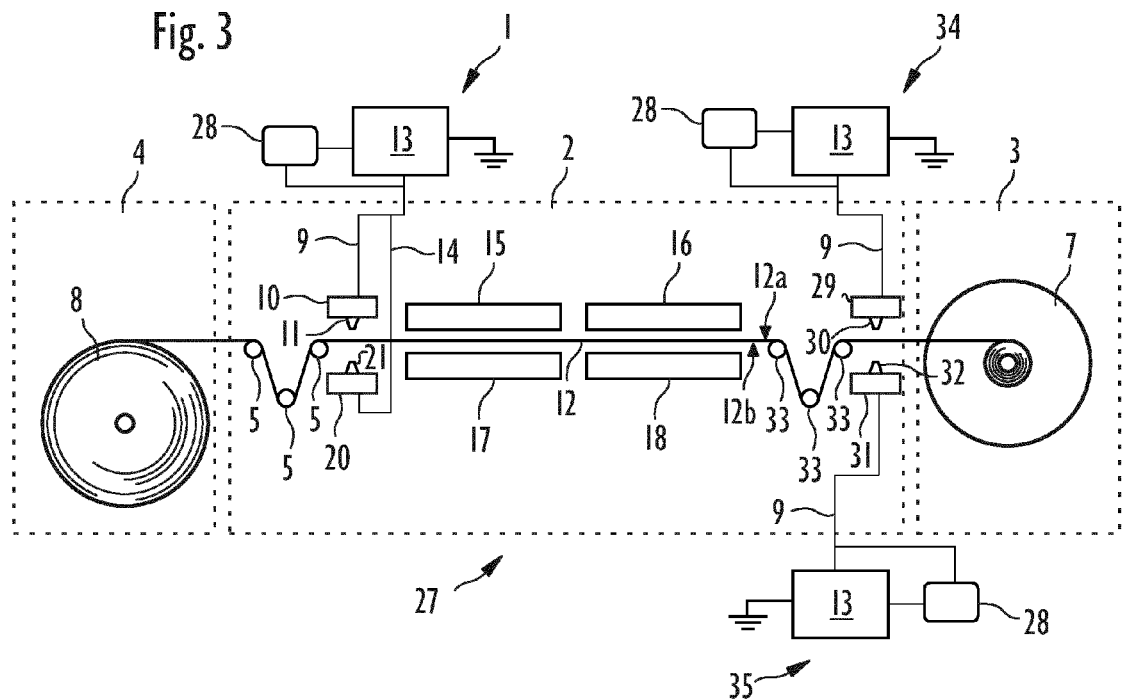
FIG. 3 is a schematic view of a substrate processing apparatus for processing a flexible substrate including four coating modules according to embodiments described herein.

FIG. 3 illustrates a web-form material coating apparatus 27 according to an example of embodiments disclosed herein. According to the example shown therein, coating apparatus 27 includes a processing chamber 2 connected to a winding up chamber 3 and an unwinding chamber 4. The coating apparatus 27 of FIG. 3 has a similar layout to web-form material processing apparatus 27 in FIG. 1 except that it includes 4 coating modules in its processing chamber 2. Coating modules 15 and 16 are positioned to face and possibly coat surface 12a of web-form substrate 12 with a thin film. Coating modules 17 and 18 are positioned to face and possibly coat surface 12b of web-form substrate 12 with a thin, for example, metallic film.

Generally, a single processing module may include more than one deposition source in separately pumped process compartments. Furthermore, coating both sides of a web-form substrate in a single processing step may be desired to maximize processing efficiency.

Figure 4:
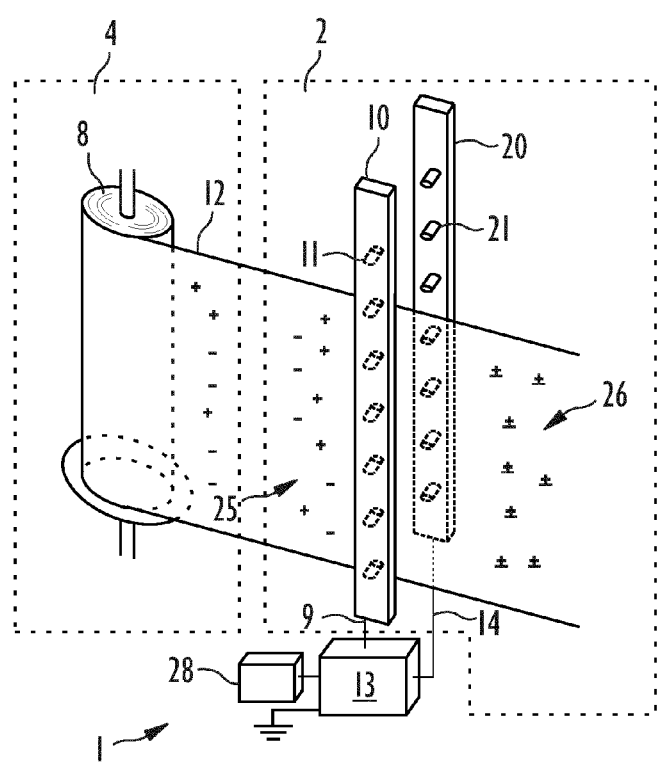
FIG. 4 is a schematic view of a substrate processing apparatus for processing a flexible substrate in a sideways vertical orientation according to embodiments described herein.

FIG. 4 illustrates part of a web-form material coating apparatus according to an example of embodiments disclosed herein. According to the example shown therein, the flexible web-form substrate 12 may pass through processing chamber 2 from unwinding module 8 located in unwinding chamber 4 such that the plane for coating or the surfaces of the web-form substrate 12 are in a vertical arrangement. Discharging assembly 1 is arranged so that the neutralization devices 10, 11 and 20, 21 are positioned inside of processing chamber 2.

In embodiments described herein, the neutralization devices 10, 11 and 20, 21 may be in the shape of a neutralization bar or lance 10, 20 with numerous spikes 11, 21 that are supplied with high voltage to enable the electrical breakdown of a processing gas to produce ions that may move in the electric field towards the surfaces of web-form substrate 12 thereby neutralizing the charges thereon. The high voltage is typically supplied by a high voltage power supply 13 via connections 9, 14 to the respective neutralizing devices 10, 11 and 20, 21. Further a control unit 28 may optionally be positioned on the outside of processing chamber 2.

In particular, FIG. 4 illustrates according to embodiments described herein that charges may accumulate on a first region 25 of the web-form substrate 12. For instance, the positive and/or negative charges may accumulate on the web-form substrate in the unwinding chamber 4. The charges may originate whilst web-form substrate 12 is unwound from unwinding module 8. The static charges may then remain on the web-form substrate 12 even when the web moves into processing chamber 2 and, hence, may attract stray particles to the surfaces of web-form substrate 12. The neutralizing devices 10, 11 and 20, 21 may provide ions of opposing polarity that move to the surfaces of web-form substrate 12 to neutralize the charges. Thereby, accumulated stray particles may effectively move away from the surfaces of the web-form substrate. Hence, the clean and discharged surfaces of the web-form substrate in region 26 may now be coated without induced arcing that may have occurred due to the accumulation of stray particles on the web's surfaces.

Figure 5:
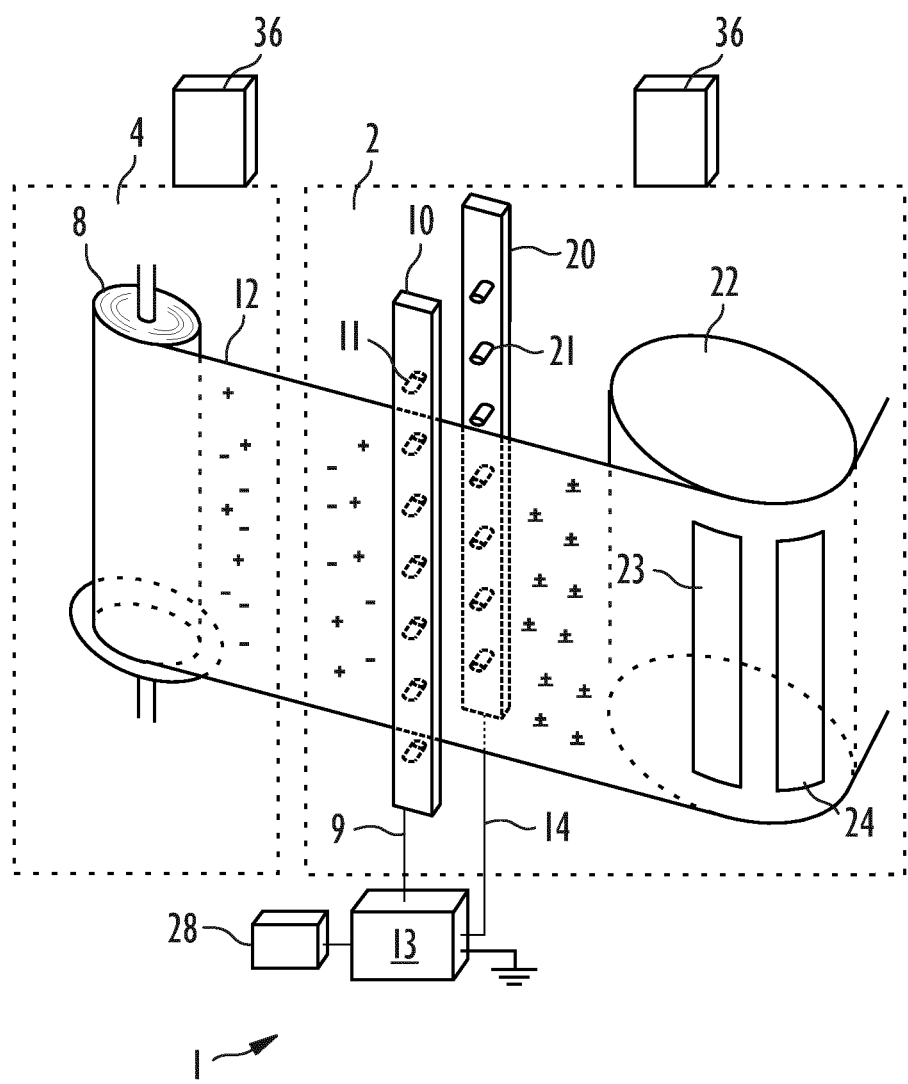
FIG. 5 is a schematic view of a substrate processing apparatus for processing a flexible substrate, in which the flexible substrate passes two coating regions according to embodiments described herein.

According to embodiments herein, FIG. 5 shows part of a web-form material coating apparatus similar to that shown in FIG. 4. However, in the present case processing chamber 2 further shows coating drum 22 that for exemplary purposes shows a first coating region 23 and a second coating region 24. These regions may be isolated from each other such that the web-form material may be coated with, for instance, two different materials. Further unwinding chamber 8 and coating chamber 2 may include one or more pumps, for example, vacuum pumps 36 which enable the processing and unwinding environments to be under controlled atmospheric conditions.

The discharging assembly 1 shown in FIG. 5 includes two discharging devices 10, 11 and 20, 21 positioned on either side of the web-form substrate 12. The discharging devices 10, 11 and 20, 21 may be provided respectively as lances 10, 20 with numerous spikes 11, 21 to which a high voltage is applied from a grounded high voltage power supply 13. Further, discharging assembly 1 may include a control unit 28 positioned outside of the processing chamber 2 that, for example, controls the level of supplied power thereby controlling the electrical breakdown of processing gas at the spikes 11, 21.

Generally, in the above described embodiments, a discharging assembly including one or more discharging devices is positioned within a vacuum chamber to provide a flow of charged ions to discharge one or both surfaces of a web-form material. The discharged web-form substrate 12 may further pass over coating drum 22 where one or more thin films of material are deposited on its surfaces.

It will be understood by those skilled in the art that in the above embodiments a coating machine will be designed for web-form materials or films, respectively, of specific dimensions and materials and for specific coating materials. Therefore, the dimensions of a web winding up or unwinding device or of a web winding up or unwinding chamber and the features of the corresponding winding up or unwinding method can be specifically adjusted to those dimensions and/or materials of the web to be coated. Thus, by knowing the dimensions and/or the materials of the webs for which the coating chamber and the coating method is designed, the skilled person can determine the suitable dimensions of a web winding up or unwinding device and/or of a web winding up or unwinding chamber and suitable features of a corresponding winding up or unwinding method such that a suitable winding up and/or unwinding of the webs is achieved. Moreover, it will be understood by those skilled in the art that in other examples of coating machines one or more discharging assemblies with one or more discharging devices as described above may be installed in variable positions within a processing chamber of the same.

Figure 6:
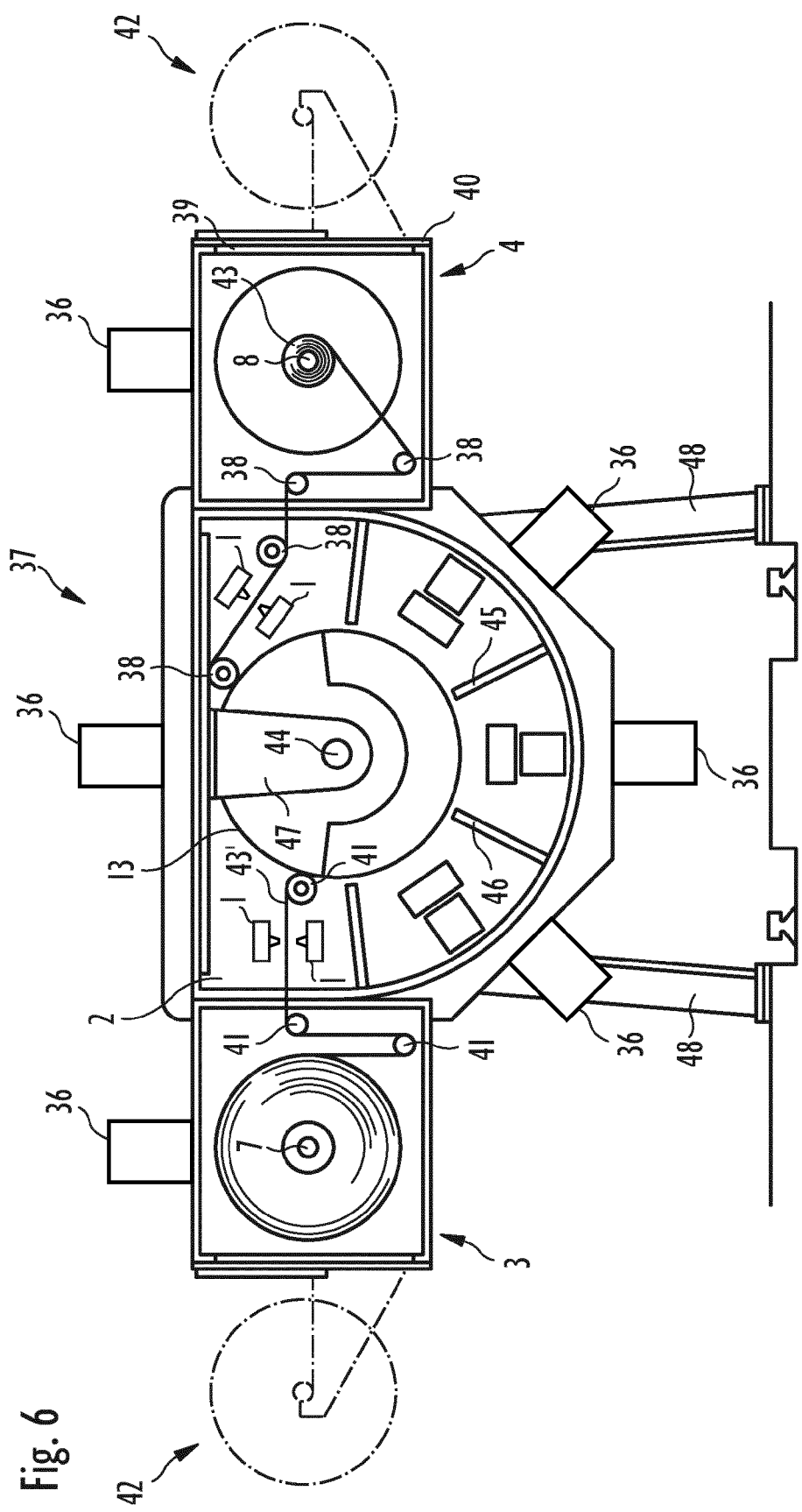
FIG. 6 is a detailed cross-sectional schematic view according to embodiments herein of a substrate processing apparatus for processing a flexible substrate, in which a flexible substrate to be coated is transported from an unwinding chamber to a winding up chamber.

FIG. 6 illustrates an example of a typical web-form material coating machine according to an example of embodiments disclosed herein, in a more detailed schematic side view. According to the example shown therein, web-form material coating machine 37 includes a winding up chamber 3 and an unwinding chamber 4, which are connected to a coating chamber 2. The web-form material coating machine 37 of FIG. 6 is typically supported on four support columns 48 and may be considered to be mirror inverted as compared to the substrate processing apparatus 27 of FIG. 1, such that the positions of the winding up chamber and the unwinding chamber are exchanged.

The unwinding chamber 4 is attached to the coating chamber 2 for feeding a web to be coated. The unwinding chamber 4 includes an unwinding module 8 as a web roll and two guide rollers 38. On the top side of the unwinding chamber 4 a vacuum pump 36 is provided, which is for evacuating the unwinding chamber 4. A feeding opening 39 of the unwinding chamber 4 is closable with a door 40.

The winding up chamber 3, which is mounted at the coating chamber 2 on the side opposite to the unwinding chamber 4, has a structure which corresponds to the structure of the winding up chamber 3 in a mirror-inverted way. Hence, it includes a winding up module 7 as a web roll, guide rollers 41 and is provided with a vacuum pump 36. A feeding-out opening of the winding up chamber 3 is closable with a door.

Further, the unwinding chamber 4 includes a web roll changing device 42, i.e. an arrangement for changing a winding cylinder that may unfold outwards to support a web roll. The effects of the web roll changing device 42 as described herein are that the web roll can be changed outside the winding up or unwinding chamber 3 or 4, respectively, and/or can be introduced laterally into the winding up or unwinding chamber 3 or 4.

Processing chamber 2 includes coating cylinder 44 mounted on a supporting element 47. The coating cylinder 44 guides an uncoated web, herein also referred to as film 43 through a series of individual deposition chambers separated from each other by walls 45, 46. Each chamber may have an individually operable vacuum pump 36. One or more sputtering cathodes (not shown in any of the FIGS.) for ejecting coating material are contained in processing chamber 2. Further, one or more discharging assemblies 1 are also contained and typically their neutralizing devices positioned within processing chamber 2 so as to discharge one or both surfaces of uncoated 43 or coated film 43' respectively.

Based on FIG. 6, an exemplary operation of the coating machine 37 will now be described. An empty winding up module 7 is introduced into the winding up chamber 3 by opening its door, unfolding and using the web roll changing device 42 to arrange thereon the empty winding up module 7 in a position outside the winding up chamber 3. Then, the empty winding up module 7 is horizontally moved to its operating position inside the winding up chamber 3 and the web roll changing device 42 is folded again. For installing an unwinding module 8 supporting film 43, the door 40 of the unwinding chamber 4 is opened. The unwinding module 8 is arranged on web roll changing device 42 and is moved horizontally from outside the unwinding chamber 4 to its operating position. Thereafter, the doors of the winding up and unwinding chambers 3 and 4 are closed and the chambers 2 to 4 are evacuated for starting the coating process.

The uncoated film 43 runs over guide rollers 38, passes by two discharging assemblies positioned such that both surfaces of the uncoated film 43 are discharged to the underside of the coating cylinder 44, where it is coated. The coated web, herein also referred to as film 43', leaves the coating chamber 2 via guide rollers 41 and passes two more discharging assemblies 1 that discharge both surfaces of the coated film 43' before finally being wound up at the winding up module 7. After the coated film 43' is fully transferred to the winding up module 7, the latter is removed from the winding up chamber 3 by opening its door, unfolding the corresponding web roll changing device 42 and transporting the winding up module 7 outside of the winding up chamber 3. There the full winding up module 7 is replaced by another empty winding up module. Likewise, the empty unwinding module 8 is exchanged by opening the door 40 of unwinding chamber 4, unfolding the web roll changing device 42, transporting the empty unwinding module 8 to a position outside of the unwinding chamber 4 and replacing it there by an unwinding module which supports a wound-up uncoated film, as described above.

Figure 7:
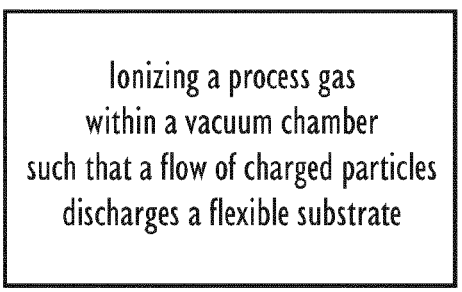
FIG. 7 is a method step which prevents unwanted particles from accumulating on a web-form substrate according to embodiments described herein.
Figure 8:
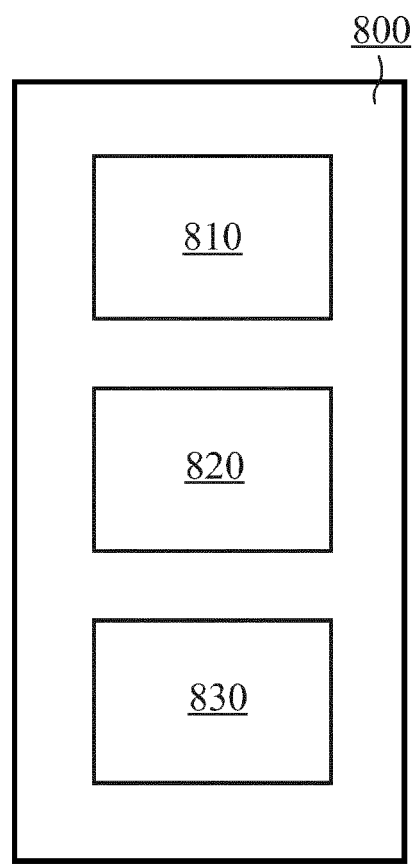
FIG. 8 are further method steps typically included in the aforementioned method step which prevents unwanted particles from accumulating on a web-form substrate according to embodiments described herein.

FIG. 7 is a chart of a method for discharging a flexible substrate within a vacuum chamber according to embodiments described herein. In block 700, a processing gas is ionized within a vacuum chamber such that a flow of charged particles discharges the flexible substrate. Typically, as shown in FIG. 8 block 800 the aforementioned method may optionally further include one or more elements chosen from the following: providing a high voltage to the one or more spikes of the one or more lances of a discharging assembly according to block 810; detecting a charge on the flexible substrate and providing a corresponding opposing charge to discharge the flexible substrate according to block 820; and, directing the flow of charged particles towards a polymeric web substrate according to block 830. Furthermore, the method may also include moving the flexible substrate from an unwinding module to a winding module, optionally at varying speeds (not shown in the FIGS.).

The above-described systems and methods enable discharging a flexible substrate within a vacuum processing chamber of a substrate processing apparatus. More specifically, discharging of the flexible substrate may be achieved by the electrical breakdown of a processing gas by a discharging assembly such that a flow of charged particles may discharge the flexible substrate. The systems and methods are not limited to the specific embodiments described herein, but rather, components of the systems and/or steps of the methods may be utilized independently and separately from other components and/or steps described herein Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. While various specific embodiments have been disclosed in the foregoing, those skilled in the art will recognize that the spirit and scope of the claims allows for equally effective modifications. Especially, mutually non-exclusive features of the embodiments described above may be combined with each other. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A substrate processing apparatus for processing a flexible substrate, comprising:
   a vacuum chamber configured for being evacuated and being configured for having a process gas provided therein;
   a processing module adapted to process the flexible substrate, wherein the processing module is provided within the vacuum chamber;
   a discharging assembly for connection to a power supply and configured to generate a flow of charged particles to discharge the flexible substrate within the vacuum chamber, wherein the discharging assembly is configured to generate an electrical field for ionizing the processing gas;
   a charge detection means for detecting a charge on the flexible substrate within the vacuum chamber before discharging; and
   a controller for connection to the power supply, wherein the controller is connected to the charge detection means and is adapted to control a polarity value and a voltage value of the power supply based on a charge detected by the charge detection means.

2. The substrate processing apparatus according to claim 1, wherein the discharging assembly includes one or more spikes configured for being provided with a high voltage.

3. The substrate processing apparatus according to claim 2, wherein the spikes are provided on one or more lances.

4. The substrate processing apparatus according to claim 2, wherein the power supply is connectable to the one or more spikes.

5. The substrate processing apparatus according to claim 2, wherein the one or more spikes are made of tungsten.

6. The substrate processing apparatus according to claim 3, wherein at least one lance is positioned to face a first surface of the substrate.

7. The substrate processing apparatus according to claim 6, wherein at least one other lance is positioned to face a second surface of the substrate that is opposite to the first surface of the substrate.

8. The substrate processing apparatus according to claim 1, wherein the controller or the power supply are positioned outside of the vacuum chamber.

9. The substrate processing apparatus according to claim 1, wherein the controller and the power supply are positioned outside of the vacuum chamber.

* * * * *